US007855666B1

(12) United States Patent
Kopikare et al.

(10) Patent No.: US 7,855,666 B1
(45) Date of Patent: *Dec. 21, 2010

(54) TRANSMITTER I/Q MISMATCH CALIBRATION FOR LOW IF DESIGN SYSTEMS

(75) Inventors: Rahul Kopikare, Livermore, CA (US); Songping Wu, Sunnyvale, CA (US); Poh Boon Leong, Singapore (SG); Thomas Cho, Fremont, CA (US); Yui Lin, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 183 days.

This patent is subject to a terminal disclaimer.

(21) Appl. No.: 12/154,071

(22) Filed: May 20, 2008

Related U.S. Application Data

(63) Continuation of application No. 11/503,044, filed on Aug. 11, 2006, now Pat. No. 7,382,297.

(60) Provisional application No. 60/748,484, filed on Dec. 8, 2005.

(51) Int. Cl.
*H03M 1/06* (2006.01)

(52) U.S. Cl. .................. 341/118; 375/343; 455/115.1

(58) Field of Classification Search ......... 341/118–120, 341/144, 155; 455/115.1, 126, 323; 375/343, 375/322
See application file for complete search history.

(56) References Cited

U.S. PATENT DOCUMENTS

| | | | |
|---|---|---|---|
| 5,894,496 A | 4/1999 | Jones | |
| 5,903,823 A | 5/1999 | Moriyama et al. | |
| 6,044,112 A | 3/2000 | Koslov | |
| 6,340,883 B1 | 1/2002 | Nara et al. | |
| 6,442,217 B1 * | 8/2002 | Cochran | 375/326 |
| 6,463,266 B1 * | 10/2002 | Shohara | 455/196.1 |
| 6,608,998 B1 * | 8/2003 | Neumann et al. | 455/296 |
| 6,763,227 B2 | 7/2004 | Kramer | |
| 6,940,930 B2 | 9/2005 | Brown et al. | |
| 7,346,122 B1 | 3/2008 | Cao | |
| 7,480,348 B2 | 1/2009 | Nakano | |
| 2003/0174641 A1 * | 9/2003 | Rahman | 370/206 |
| 2003/0174783 A1 | 9/2003 | Rahman et al. | |

(Continued)

OTHER PUBLICATIONS

IEEE Std 802.11h—2003 (Amendment to IEEE Std 802.11, 1999 Edition (Reaff 2003)); as amended by IEEE Stds 802.11a-1999, 802.11b-1999, 802.11b-1999/Cor 1-2001, 802.11d-2001, and 802.11g-2003; IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

(Continued)

*Primary Examiner*—Jean B Jeanglaude

(57) ABSTRACT

A calibration module includes an absolute value module that generates first and second magnitude signals based on a first signal and a second signal, respectively. A first module generates an amplitude correction signal for a quadrature-amplitude modulated (QAM) signal based on the first and second magnitude signals. A second module generates a phase correction signal for the QAM signal based on the first signal and the second signal.

37 Claims, 9 Drawing Sheets

U.S. PATENT DOCUMENTS

| | | |
|---|---|---|
| 2003/0231723 A1 | 12/2003 | Hansen |
| 2004/0146120 A1 | 7/2004 | Brown |
| 2004/0152436 A1 | 8/2004 | Masenten et al. |
| 2005/0075815 A1 | 4/2005 | Webster |
| 2005/0148304 A1 | 7/2005 | Jerng |
| 2005/0152463 A1 | 7/2005 | DeChamps et al. |
| 2005/0219087 A1 | 10/2005 | Chang et al. |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

802.11n; IEEE P802.11-04/0889r6; Wireless LANs, TGn Sync Proposal Technical Specification; 131 pages.

IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.

IEEE P802.11g/D8.2, Apr. 2003 (Supplement to ANSI/IEEE Std 802.11-1999(Reaff 2003)); DRAFT Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.16/2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

Specification of the Bluetooth System Master Table of Contents & Compliance Requirements; Covered Core Package version: 2.0+EDR Current Master TOC issued: Nov. 4, 2004; pp. 1-72; pp. 1-92; pp. 1-812; 1-248.

* cited by examiner

TRANSMITTER I/Q MISMATCH CALIBRATION FOR LOW IF DESIGN SYSTEMS

CROSS-REFERENCE TO RELATED APPLICATIONS

This application is a continuation of U.S. patent application Ser. No. 11/503,044, filed Aug. 11, 2006, now U.S. Pat. No. 7,382,297, which claims the benefit of U.S. Provisional Application No. 60/748,484 filed on Dec. 8, 2005. The disclosures of the above applications are incorporated herein by reference in their entirety.

FIELD

The present disclosure relates to correcting amplitude and/or phase mismatch in quadrature amplitude modulation (QAM) mode transmitters.

BACKGROUND

QAM mode transmitters generate a radio frequency (RF) signal that is formed by adding modulated sinusoid and cosine carriers, which are also referred to as in-phase (I) and quadrature (Q) signals, respectively. The I and Q signals can be digitally generated at a lower frequency and then upconverted to a carrier frequency. The I and Q signals can be upconverted with a pair of analog mixers—one mixer for the I signal and the other mixer for the Q signal. The analog mixers are generally less expensive than their digital counterparts and therefore more popular.

In an ideal case, the amplitudes of the unmodulated I and Q signals are equal and the I and Q signals are exactly 90° out of phase with each other. However, variances in the analog mixer pairs distort or mismatch these relationships. The mismatch is referred to as I/Q mismatch. Since a receiver may incorrectly interpret the I/Q mismatch as an information signal, it is important for the transmitter to minimize the I/Q mismatch.

Referring now to FIG. 1, a functional block diagram is shown of an I/Q-mismatch compensated transceiver 10 according to the prior art. Transceiver 10 includes a transmitter section 12, a receiver section 14, and an I/Q mismatch calibration section 16.

Transmitter section 12 includes an I/Q predistortion module 24 that compensates the magnitude and/or phase relationship of I and Q signals. The compensation is based on an amplitude correction signal $\alpha_{est}$ and a phase correction signal $\beta_{est}$, referred to collectively as correction signals, that are generated by calibration section 16. I/Q predistortion module 24 compensates for the I/Q mismatch that may be introduced by a pair of analog mixers included in an analog transmitter 30.

During a calibration sequence, a loopback switch 44 is closed and couples the output of transmitter section 12 to an input of receiver section 14. Calibration section 16 then measures the I/Q mismatch introduced by the mixers in analog transmitter 30. Calibration section 16 generates the correction signals based on the measurement. I/Q predistortion module 24 then compensates the magnitude and/or phase relationship of the I and Q signals to eliminate the I/Q mismatch at the outputs of analog transmitter 30.

A transmit filter module 26 filters harmonics from the I and Q signals. Outputs of transmit filter module 26 communicate the I and Q signals to respective inputs of a digital-to-analog converter (DAC) 28. DAC 28 converts the digital I and Q signals to corresponding analog signals. The analog I and Q signals communicate with respective inputs of analog transmitter 30.

Receiver section 14 includes an analog receiver 32. Analog receiver 32 includes a second pair of analog mixers that regenerate the I and Q signals from the RF carrier. The second pair of analog mixers introduces additional I/Q mismatch into the received I and Q signals. An analog-to-digital converter (ADC) 36 converts the analog I and Q signals into digital I and Q signals. A receive low-pass filter (LPF) 36 filters harmonic frequencies and communicates the filtered I and Q signals to a receive I/Q compensation module 38. I/Q compensation module 38 compensates the digital I and Q signals based on the correction signals from calibration section 16 and compensates for the I/Q mismatch that was introduced by analog receiver 32.

Based on a DO_CALIB signal, a demultiplexer 40 routes the compensated I and Q signals to calibration section 16 or a carrier recovery module 42. The DO_CALIB signal, and a CALIB_MODE signal that is used by a demultiplexer 50, are asserted while transceiver 10 is being calibrated for I/Q mismatch.

Calibration section 16 includes an I/Q calibrator module 48 that measures the I/Q mismatch between I and Q signals that enter calibration section 16. I/Q calibrator module 48 then generates the correction signals based on the I/Q mismatch. Based on the CALIB_MODE signal, a demultiplexer 50 then routes the correction signals to transmit I/Q predistortion module 24 or receive I/Q compensation module 38.

Operation of transceiver 10 will now be described. Transceiver 10 supports three operating modes—a receiver calibration mode, a transmitter calibration mode, and a normal operating mode. The I/Q mismatch calibration process begins in the receiver calibration mode.

In the receiver calibration mode loopback switch 44 is opened, a switch 46 is closed, and the DO_CALIB and CALIB_MODE signals are set equal to "1". Switch 46 connects the input of analog receiver 32 to a source 52. Source 52 generates a reference RF carrier that includes ideal I and Q signals. The analog mixer in analog receiver 32 introduce receiver I/Q mismatch to the ideal I and Q signals. I/Q calibrator module 48 measures the receiver I/Q mismatch and based thereon generates the correction signals. Demultiplexer 50 routes the correction signals to receive I/Q compensation block 38. I/Q compensation block 38 stores the correction signal values and thereafter compensates the received I and Q signals to eliminate the receiver I/Q mismatch.

Transceiver 10 then enters the transmitter calibration mode. In the transmitter calibration mode switch 46 is opened, loopback switch 44 is closed, the DO_CALIB signal is set equal to "1", and the CALIB_MODE signal is set equal to "0". Since receiver section 14 has already been compensated, I/Q calibrator module 48 can measure the transmitter I/Q mismatch and generate the correction signals for transmitter section 12. Multiplexer 50 routes the correction signals to I/Q predistortion module 24. I/Q predistortion module 24 stores the correction signal values and thereafter compensates the I and Q signals to eliminate the transmitter I/Q mismatch. The normal operating mode can then be entered by opening loopback switch 44 and switch 46, and setting the DO_CALIB and CALIB_MODE signals equal to "0".

Referring now to FIG. 2, a transmitter 60 is shown that employs an alternate method of generating the correction signals for I/Q predistortion module 24. A spectrum analyzer 62 monitors the RF carrier signal while known data signals are communicated into IFFT module 18. Spectrum analyzer 62 then measures the I/Q mismatch introduced by analog transmitter 30 and generates the correction signals accordingly. I/Q predistortion module 24 stores the correction signals and compensates the I and Q signals accordingly.

The above methods calibrate transmitters 12 and 60 for I/Q mismatch at a single frequency. The methods can be repeated to calibrate for I/Q mismatch at a number of frequencies. For example, unique correction signals can be generated for corresponding RF bands and/or frequencies used by the Institute of Electrical and Electronics Engineers (IEEE) standards 802.11, 802.11a, 802.11b, 802.11g, 802.11h, 802.11n, 802.16, and 802.20, and/or used by the Bluetooth Special Interest Group (SIG) Bluetooth standard. The aforementioned standards are hereby incorporated by reference in their entirety. I/Q predistortion module 24 can then store the plurality of correction values and use the correction values associated with the carrier frequency being used.

While the above circuits and methods address the issue of I/Q mismatch, they include some undesirable aspects. For example, the method used with transmitter section 12 is dependent on calibrating receiver section 14. If receiver section 14 is improperly calibrated then the error will adversely affect the correction signals that are generated for transmitter section 12. Transmitter 60 of FIG. 2 overcomes the issue by calibrating independently of a receiver section; however it can take an unacceptable amount of time to connect the spectrum analyzer and generate the known data signals.

SUMMARY

A calibration module includes a first input that receives a reference signal, a second input that receives a crosstalk signal, and first and second absolute value modules that generate first and second magnitude signals based on the reference signal and the crosstalk signal, respectively. A first module generates an amplitude correction signal for a quadrature-amplitude modulated (QAM) signal based on the first and second magnitude signals. A second module generates a phase correction signal for the QAM signal based on the reference signal and the crosstalk signal.

In other features the first module employs a difference function. The second module employs a multiplication function. The reference signal includes a first phase angle. The crosstalk signal is out-of-phase with the first phase angle. The crosstalk signal is approximately ninety degrees out-of-phase with the first phase angle.

In other features the calibration module includes first and second multiplication modules that multiply the magnitudes of respective ones of the amplitude and phase correction signals. First and second buffers store the amplitude and phase correction signals, respectively. The first and second buffers include respective inputs and outputs and further include feedback paths between the respective inputs and the outputs. At least one of the feedback paths includes a saturation module that limits the magnitude of a feedback signal.

In other features a QAM mode transmitter includes the calibration module. The QAM mode transmitter includes a compensation module that generates compensated in-phase (I) and quadrature (Q) signals based on the amplitude and phase correction signals; and first and second analog mixers that convert respective ones of the compensated I and Q signals to a carrier frequency.

A self-calibrating quadrature amplitude modulation (QAM) mode transceiver includes a transmitter. The transmitter includes a generator that generates digitized in-phase (I) and quadrature (Q) signals, a compensation module that generates compensated I and Q signals based on the digitized I and Q signals and amplitude and phase correction signals, a digital-to-analog converter module that generates analog I and Q signals based on the compensated I and Q signals, a first analog mixer module that generates a radio-frequency (RF) transmit signal based on the analog I and Q signals, and a calibration module that generates the amplitude and phase correction signals based on the analog I signal component of the RF transmit signal.

In other features the transceiver includes a receiver. The receiver includes a second analog mixer module that generates an I component signal based on the RF transmit signal. The I component signal includes an analog Q crosstalk signal. An analog-to-digital converter (ADC) converts the I component signal to a digitized I component signal. A digital mixer generates a reconstructed digitized I signal and a digitized Q crosstalk signal based on the digitized I component signal. The calibration module generates the amplitude and phase correction signals based on the reconstructed digitized I signal and the digitized Q crosstalk signal. The second analog mixer module further generates a Q component signal based on the RF transmit signal. The receiver further comprises a band-pass filter (BPF) positioned between the second analog mixer module and the ADC. A switch selectively routes the I component signal around the BPF.

A method of calibrating a quadrature-amplitude modulated (QAM) signal includes receiving a reference signal, receiving a crosstalk signal, and generating first and second magnitude signals based on the reference signal and the crosstalk signal, respectively. The method also includes generating an amplitude correction signal for the QAM signal based on the first and second magnitude signals and generating a phase correction signal for the QAM signal based on the reference signal and the crosstalk signal.

In other features the step of generating the amplitude correction signal employs a difference function. The step of generating the phase correction signal employs a multiplication function. The reference signal includes a first phase angle and the crosstalk signal is out-of-phase with the first phase angle. The crosstalk signal is approximately ninety degrees out-of-phase with the first phase angle. The method includes scaling the magnitudes of the amplitude and phase correction signals and buffering the amplitude and phase correction signals. The amplitude and phase correction signals are buffered individually and each buffering step includes generating a feedback signal that is input to the buffering step. The method includes limiting a magnitude of the feedback signal.

A method of self-calibrating a quadrature amplitude modulation (QAM) mode transceiver includes generating digitized in-phase (I) and quadrature (Q) signals. The method includes generating compensated I and Q signals based on the digitized I and Q signals and amplitude and phase correction signals. The method includes generating analog I and Q signals based on the compensated I and Q signals, generating a radio-frequency (RF) transmit signal based on the analog I and Q signals, and generating amplitude and phase correction signals based on the analog I signal component of the RF transmit signal.

In other features the method includes generating an I component signal based on the RF transmit signal. The I component signal includes an analog Q crosstalk signal. The method includes converting the I component signal to a digitized I component signal and generating a reconstructed digitized I signal and a digitized Q crosstalk signal based on the digitized I component signal. The method includes generating the amplitude and phase correction signals based on the reconstructed digitized I signal and the digitized Q crosstalk signal. The method includes generating a Q component signals based on the RF transmit signal. The method includes band-pass filtering the I and Q component signals that are based on the RF transmit signal. The method includes selectively routing the I component signal that is based on the RF transmit signal around the band-pass filtering step.

A calibration module includes first input means for receiving a reference signal, second input means for receiving a crosstalk signal, and first and second absolute value means for generating first and second magnitude signals based on the reference signal and the crosstalk signal, respectively. The calibration module also includes first means for generating an amplitude correction signal for a quadrature-amplitude modulated (QAM) signal based on the first and second magnitude signals; and second means for generating a phase correction signal for the QAM signal based on the reference signal and the crosstalk signal.

In other features the first means employs a difference function. The second means employs a multiplication function. The reference signal includes a first phase angle. The crosstalk signal is out-of-phase with the first phase angle. The crosstalk signal is approximately ninety degrees out-of-phase with the first phase angle.

In other features the calibration module includes first and second multiplication means for multiplying the magnitudes of respective ones of the amplitude and phase correction signals. The calibration module includes first and second buffer means for storing the amplitude and phase correction signals respectively. The first and second buffer means include respective inputs and outputs and respective feedback path means for communicating feedback between the outputs and the inputs. At least one of the feedback paths means includes saturation means for limiting the magnitude of a feedback signal.

In other features a QAM mode transmitter includes the calibration module. The QAM mode transmitter includes compensation means for generating compensated in-phase (I) and quadrature (Q) signals based on the amplitude and phase correction signals. The QAM mode transmitter also includes first and second analog mixing means for converting respective ones of the compensated I and Q signals to a carrier frequency.

A self-calibrating quadrature amplitude modulation (QAM) mode transceiver includes a transmitter. The transmitter includes generator means for generating digitized in-phase (I) and quadrature (Q) signals, compensation means for generating compensated I and Q signals based on the digitized I and Q signals and amplitude and phase correction signals, digital-to-analog converter means for generating analog I and Q signals based on the compensated I and Q signals, first analog mixer means for generating a radio-frequency (RF) transmit signal based on the analog I and Q signals, and calibration means for generating the amplitude and phase correction signals based on the analog I signal component of the RF transmit signal.

In other features the transceiver includes a receiver. The receiver includes second analog mixer means for generating an I component signal based on the RF transmit signal. The I component signal includes an analog Q crosstalk signal. The receiver also includes analog-to-digital converter (ADC) means for converting the I component signal to a digitized I component signal, and digital mixer means for generating a reconstructed digitized I signal and a digitized Q crosstalk signal based on the digitized I component signal. The calibration means generates the amplitude and phase correction signals based on the reconstructed digitized I signal and the digitized Q crosstalk signal.

In other features the second analog mixer means further generates a Q component signal based on the RF transmit signal. The receiver includes a band-pass filter (BPF) means for filtering the I and Q component signals communicated from the second analog mixer means to the ADC module. The receiver includes switching means for selectively routing the I component signal around the BPF means.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
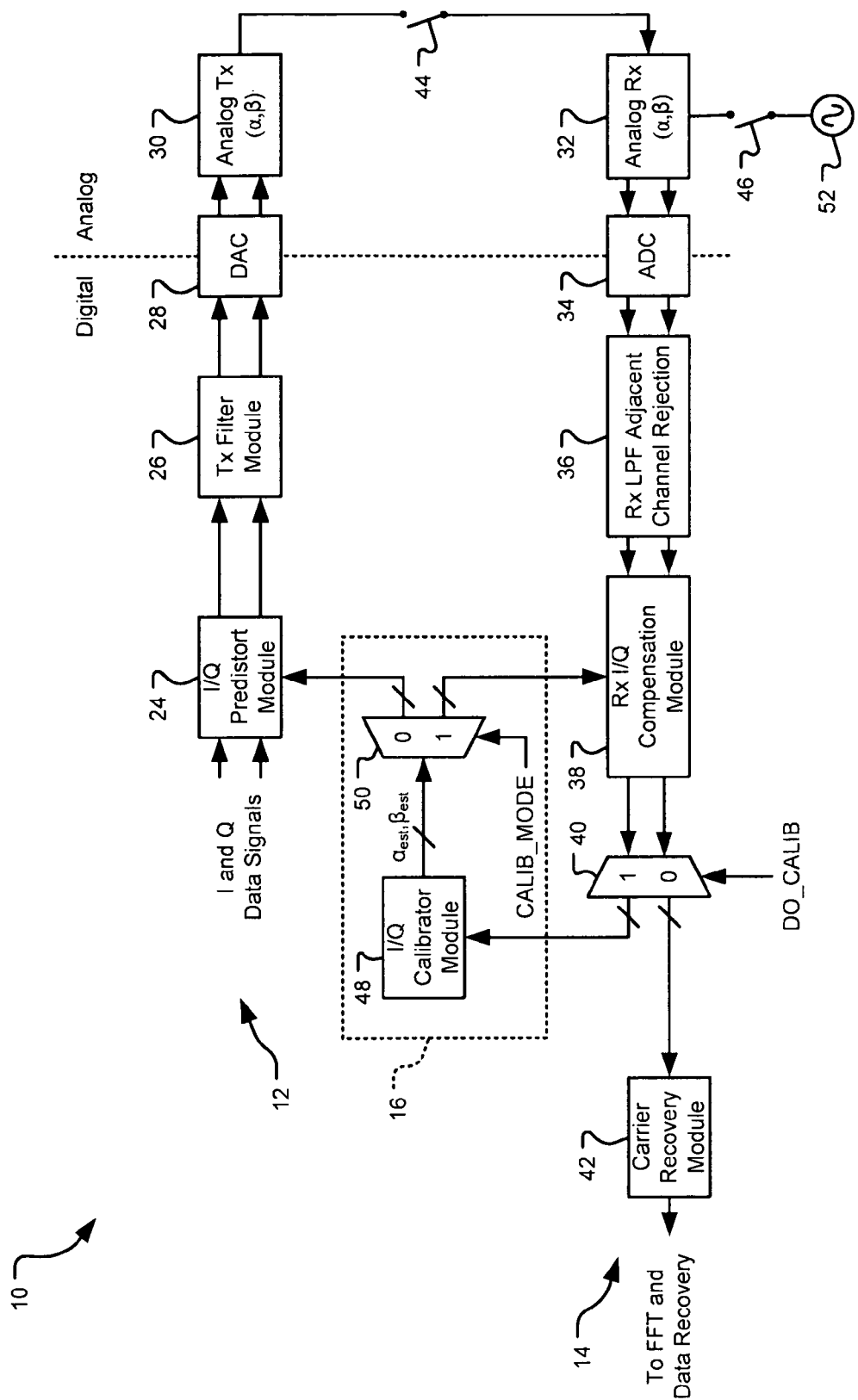
FIG. 1 is a functional block diagram of a self-calibrating I/Q mismatch compensated transceiver according to the prior art.
Figure 2:
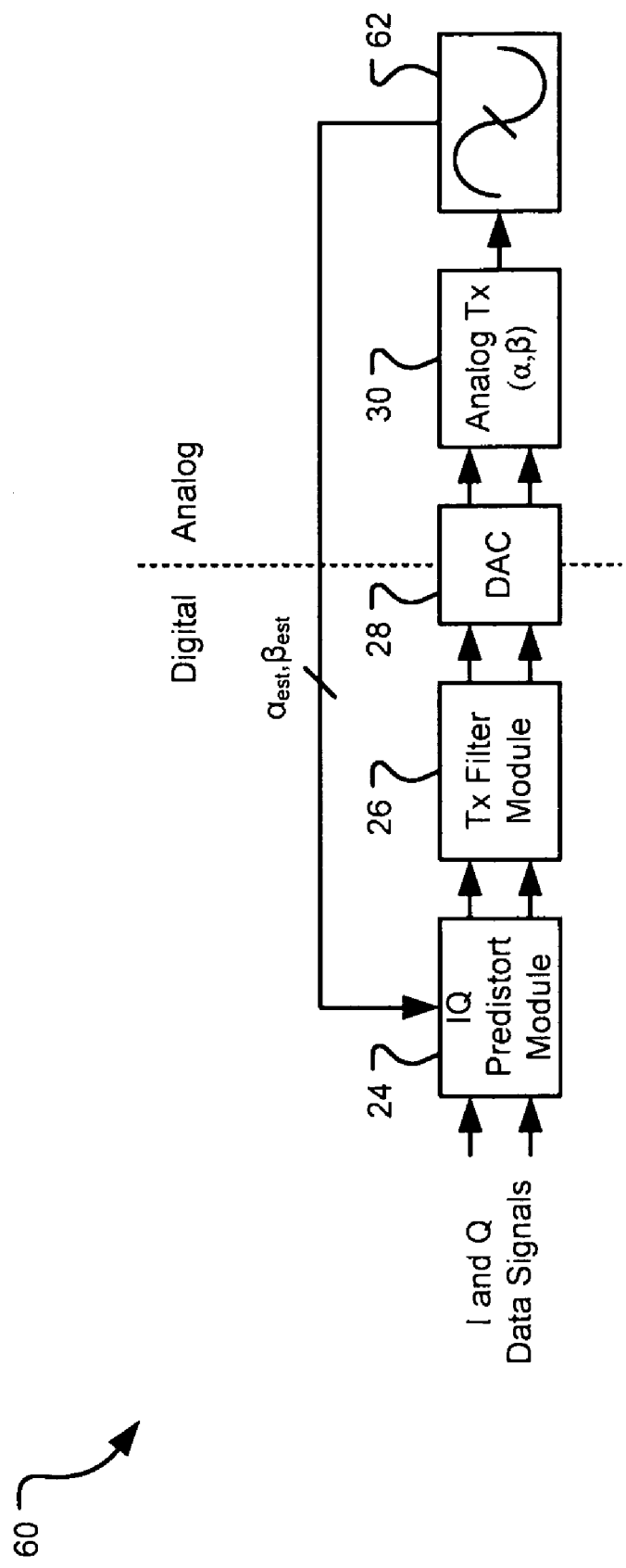
FIG. 2 is a functional block diagram of an I/Q mismatch-compensated transmitter according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
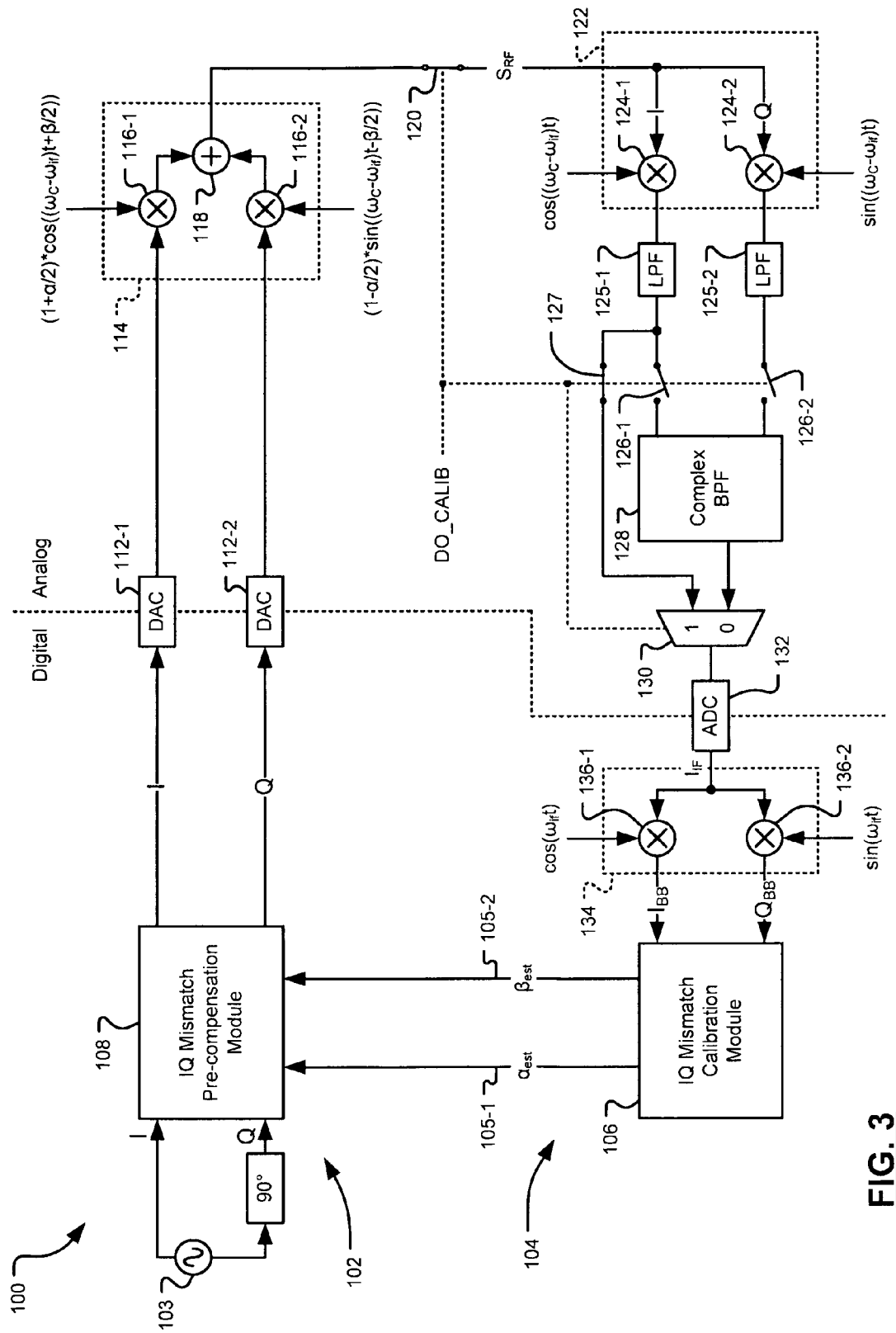
FIG. 3 is a functional block diagram of an improved self-calibrating I/Q mismatch compensated transceiver.

Referring now to FIG. 3, a functional block diagram is shown of an I/Q-mismatch compensated transceiver 100. Transceiver 100 can be implemented as a system-on-chip (SOC). Transceiver 100 includes a transmitter section 102 and a receiver section 104. Receiver section 104 includes an I/Q mismatch calibration module (I/Q-MCM) 106 that generates an amplitude correction signal $\alpha_{est}$ 105-1 and a phase correction signal $\beta_{est}$ 105-2, collectively referred to as correction signals 105. I/Q-MCM 106 generates correction signals 105 based on one of I and Q signals in receiver section 104. I/Q-MCM 106 therefore enables transmitter section 102 to self-calibrate for I/Q mismatch regardless of whether receiver section 104 is I/Q mismatched.

Transmitter section 102 includes an I/Q mismatch precompensation module 108 that compensates in-phase (I) and quadrature (Q) signals based on correction signals 105. During a calibration mode, which is described below, a reference signal generator 103 generates digitized I and Q signals. DACs 112 convert the digitized I and Q signals to respective analog I and Q signals.

An analog transmitter 114 includes a first analog mixer 116-1 and a second analog mixer 116-2. First analog mixer 116-1 generates an I component of the modulated RF carrier by mixing by the analog I signal with a signal based on the equation $\cos((\omega_c - \omega_{if})t)$, where $\omega_c$ represents the period of the RF carrier, $\omega_{if}$ represent the period of the IF, and t represents time. Second analog mixer 116-2 generates a Q component of the modulated RF carrier by mixing the analog Q signal with a signal based on the equation $\sin((\omega_c - \omega_{if})t)$.

Each analog mixer 116 may have unity gain for amplitude and phase. However, due to variables in material and manufacturing, each analog mixer 116 may have slightly different amplitude and phase gains. These different amplitude and phase gains generate an undesirable amplitude difference $\alpha$ and/or an undesirable phase error $\beta$ between the I and Q components. The amplitude mismatch $\alpha$ and the phase mismatch $\beta$ can be modeled in the mixing signals. The mixing signal for analog mixer 116-1 then becomes $$(1+\alpha/2)\cos((\omega_c-\omega_{if})t)+(\beta/2) \qquad \text{Eq. 1}$$

and the mixing signal for analog mixer 116-2 becomes $$(1-\alpha/2)\sin((\omega_c-\omega_{if})t)-\beta/2 \qquad \text{Eq. 2}$$

Eq. 1 is multiplied by the analog I signal to obtain the I component of the RF carrier. Likewise, Eq. 2 is multiplied by the analog Q signal to obtain the Q component of the RF carrier. It can be seen from Eqs. 1 and 2 that the I and Q components each include information regarding the amplitude mismatch $\alpha$ and the phase mismatch $\beta$. I/Q-MCM 106 uses the information to generate the correction signals 105 based on equations that are described below.

Analog transmitter 114 includes an adder 118 that generates the RF carrier based on the I and Q components. During I/Q mismatch calibration the RF carrier can be looped back, via a loopback switch 120, to an input of receiver section 104. Loop back switch 120 can be implemented with a transistor and controlled via a control signal DO_CALIB.

Receiver section 104 includes an analog receiver 122 that receives the looped-back RF carrier. Analog receiver 122 includes a pair of analog mixers 124-1 and 124-2 that each receive the RF carrier. Analog mixer 124-1 reproduces the I component at the IF by mixing the RF carrier with a signal based on the equation $\cos((\omega_c - \omega_{if})t)$. Analog mixer 124-2 reproduces the Q component at the IF by mixing the RF carrier with a signal based on the equation $\sin((\omega_c - \omega_{if})t)$.

During normal operation the reproduced I and Q components communicate through respective low-pass filters 125 and switches 126 to respective inputs of a complex bandpass filter (BPF) 128. However, during the calibration mode, the control signal DO_CALIB opens switches 126 and closes switch 127. Switches 126 and 127 can be implemented with transistors. Switch 127 selectively connects one of the reproduced I and Q components to an input of a multiplexer 130, bypassing complex BPF 128. While FIG. 3 shows one end of switch 127 being connected to the output of analog mixer 124-1 it should be appreciated that the connection can be moved to the output of second mixer 124-2 without adversely affecting the operation of transceiver 100.

During the calibration mode multiplexer 130 routes the second end of switch 127 to an input of an ADC 132. ADC 132 converts the reproduced I component to a reproduced digital I signal. The reproduced digital I signal is communicated to a digital mixer 134 that downconverts the reproduced digital I signal from the IF to the baseband frequency.

Digital mixer 134 includes first and second mixers 136-1, 136-2 that mix the reproduced digital I signal with signals based on the equations $\cos(\omega_{if}t)$ and $\sin(\omega_{if}t)$, respectively. The output of first mixer 136-1 includes a reproduction of the component I signal. The output of second mixer 136-2 includes a portion of the compensated Q signal. The Q-signal portion, or crosstalk portion, entered the I component of the RF carrier due to the I/Q mismatch in analog transmitter 114. The reproduced digital I signal and the crosstalk portion are applied to respective inputs of I/Q-MCM 106. I/Q-MCM 106 then estimates the amplitude mismatch $\alpha$ and the phase mismatch $\beta$ and generates corresponding correction signals 105.

I/Q-MCM 106 can employ equations that are included in the following mathematical derivation. The derivation provides a solution for estimating the amplitude mismatch $\alpha$ and the phase mismatch $\beta$ based on the reproduced digital I signal and the crosstalk portion.

The RF carrier signal that is received by analog receiver 122 can be described by the equation:

$$S_{RF} = (1+\alpha/2)I\cos(\omega_c t + \beta/2) + (1-\alpha/2)Q\sin(\omega_c t - \beta/2) \qquad \text{Eq. 3}$$

The reproduced I component at the output of analog mixer 124-1 can then be described by the equation:

$$I_{IF} = I[\cos((2\omega_c + \omega_{if})t) + \cos(\omega_c t)] + Q[\sin((2\omega_c - \omega_{if})t) + \sin(\omega_{if}t)] \qquad \text{Eq. 4}$$

LPFs 125 diminish signals at frequencies above the IF and the reproduced I component at the output of LPF 125-1 can then be described by the simplified equation:

$$I_{IF} = (S_{RF})\cos((\omega_c - \omega_{if})t) \qquad \text{Eq. 5}$$
$$= (1+\alpha/2)|\cos(\omega_{if}t + \beta/2) + (1-\alpha/2)Q\sin(\omega_{if}t - \beta/2) \qquad \text{Eq. 6}$$

The reproduced digital I signal at the output of first mixer 136-1 can be described by the equation:

$$I_{BB} = (I_{IF})\cos(\omega_{if}t) \qquad \text{Eq. 7}$$
$$= (1+\alpha/2)I\cos(\beta/2) - (1-\alpha/2)Q\sin(\beta/2) \qquad \text{Eq. 8}$$

The crosstalk portion at the output of second mixer 136-2 can be described by the equation:

$$Q_{BB} = (1+\alpha/2)I\sin((\beta/2) - (1-\alpha/2)Q\cos(\beta/2) \qquad \text{Eq. 9}$$

Eq. 9 assumes that signal components at 2$\omega_{if}$ are removed by LPF 125-1.

$I_{BB}$ and $Q_{BB}$ are communicated to respective inputs of I/Q-MCM 106, which estimates $\int(I_{BB}^2 - Q_{BB}^2)$ and $\int I_{BB} \times Q_{BB}$. Using Eq. 8 and Eq. 9, $$I_{BB}^2 - Q_{BB}^2 = (1 + \alpha/2)^2 I^2 \cos^2(\beta/2) + (1 - \alpha/2)^2 Q^2 \sin^2(\beta/2) -$$
$$2(1 - \alpha^2/4) IQ \sin\beta/2 - [(1 + \alpha/2)^2 I^2 \sin^2(\beta/2) +$$
$$(1 - \alpha/2)^2 Q^2 \cos^2(\beta/2) - 2(1 - \alpha^2/4) IQ \sin\beta/2]$$
$$= (1 + \alpha/2)^2 I^2 (\cos^2(\beta/2) - \sin^2(\beta/2)) -$$
$$(1 - \alpha/2)^2 Q^2 (\cos^2(\beta/2) - \sin^2(\beta/2))$$
$$= [I^2 + \alpha I^2 + \alpha^2/4 I^2 - Q^2 + \alpha Q^2 - \alpha^2/4 Q^2](\cos\beta)$$
$$= [(I^2 - Q^2)(1 - \alpha^2/4) + \alpha(I^2 + Q^2)]\cos\beta$$

Noting that $I = \cos(\omega_{BB} t)$ and $Q = \sin(\omega_{BB} t)$, $$\int_0^T (I^2 - Q^2) dt = 0,$$
$$\int_0^T (I^2 + Q^2) dt = T, \int_0^T IQ \, dt = 0.$$

It can also be assumed that $\beta$ is small. Hence $\cos\beta = 1$ and $\alpha \ll 1$. Hence $\alpha^2/4 \approx 0$. Thus $$\int_0^T (I_{BB}^2 - Q_{BB}^2) dt = T\alpha = \text{constant} \times \alpha \qquad \text{Eq. 10}$$

Now considering $\int_0^T I_{BB} Q_{BB} dt$, $$I_{BB} Q_{BB} = (1 + \alpha/2)^2 I^2 \sin\beta/2 + (1 - \alpha/2)^2 Q^2 \sin\beta/2 -$$
$$(1 - \alpha^2/4) I/Q (\cos^2(\beta/2) + \sin^2(\beta/2))$$
$$= \sin\beta/2 [I^2 + \alpha I^2 \alpha^2 I^2/4 + Q^2 - \alpha Q^2 \alpha^2 Q^2/4] - (1 - \alpha^2/4)$$
$$I/Q$$

From the above assumption that $\beta$ is small, $$\int_0^T I_{BB} Q_{BB} dt = T\beta = \text{constant} \times \beta \qquad \text{Eq. 11}$$

I/Q-MCM 106 can therefore employ Eq. 10 and Eq. 11 to estimate the amplitude mismatch $\alpha$ and the phase mismatch $\beta$ respectively and generate corresponding correction signals 105.

Figure 4:
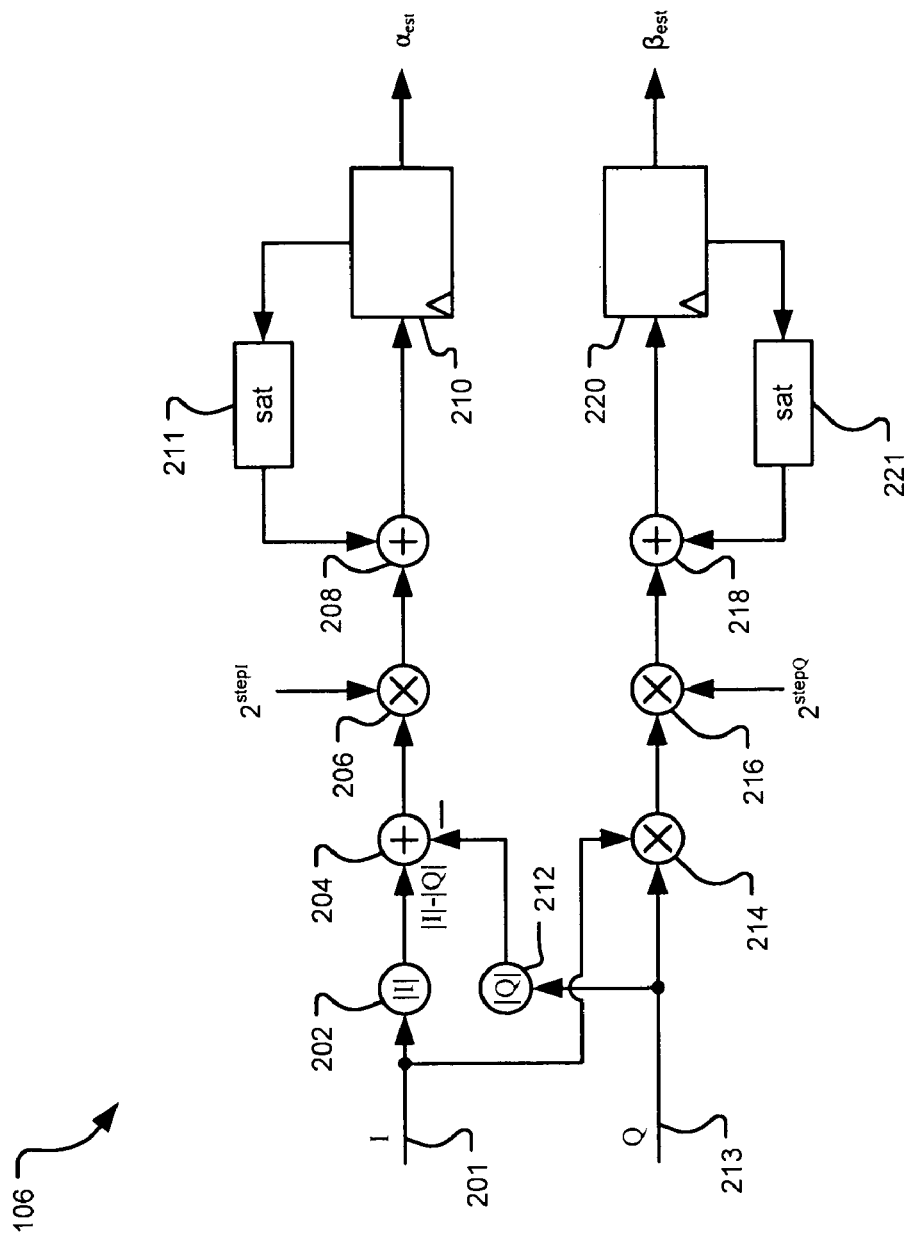
FIG. 4 is a system diagram of an I/Q calibration module for the transceiver of FIG. 3.

Referring now to FIG. 4, a functional block diagram is shown of I/Q-MCM 106. A first input 201 receives the reproduced digital I signal and communicates with an input of a first absolute value module 202. An output of first absolute value module 202 communicates with an input of a summation module 204. An output of summation module 204 communicates with an input of a scaling module 206. Scaling module 206 provides a gain of $2^{stePI}$, where stepI is an integer less than or equal to zero. An output of scaling module 206 communicates with an input of a summation module 208. Summation module 208 communicates instantaneous estimates of the amplitude mismatch a to a buffer 210. Buffer 210 generates $\alpha_{est}$ 105-1 and communicates $\alpha_{est}$ 105-1 to an output and to an input of a saturation filter 211. $\alpha_{est}$ 105-1 is a signed binary integer and saturation filter 211 prevents $\alpha_{est}$ 105-1 from rolling over after it saturates. An output of saturation filter 211 communicates with a second input of summation module 208.

A second input 213 receives the crosstalk portion and communicates with an input of a second absolute value module 212 and an input of a multiplication module 214. An output of second absolute value module 212 communicates with a second input of summation module 204. First input 201 communicates with a second input of multiplication module 214. An output of multiplication module 214 communicates with an input of a scaling module 216. Scaling module 216 provides a gain of $2^{stePQ}$, where stepQ is an integer less than or equal to zero. An output of scaling module 216 communicates with an input of a summation module 218. Summation module 218 communicates instantaneous values of the phase mismatch 13 to a buffer 220. Buffer 220 generates p est 105-2 and communicates $\beta_{est}$ 105-2 to an output and to an input of a saturation filter 221. $\beta_{est}$ 105-2 is a signed binary integer and saturation filter 221 prevents $\beta_{est}$ 105-2 from rolling over after it saturates. An output of saturation filter 221 communicates with a second input of summation module 218.

Figure 5:
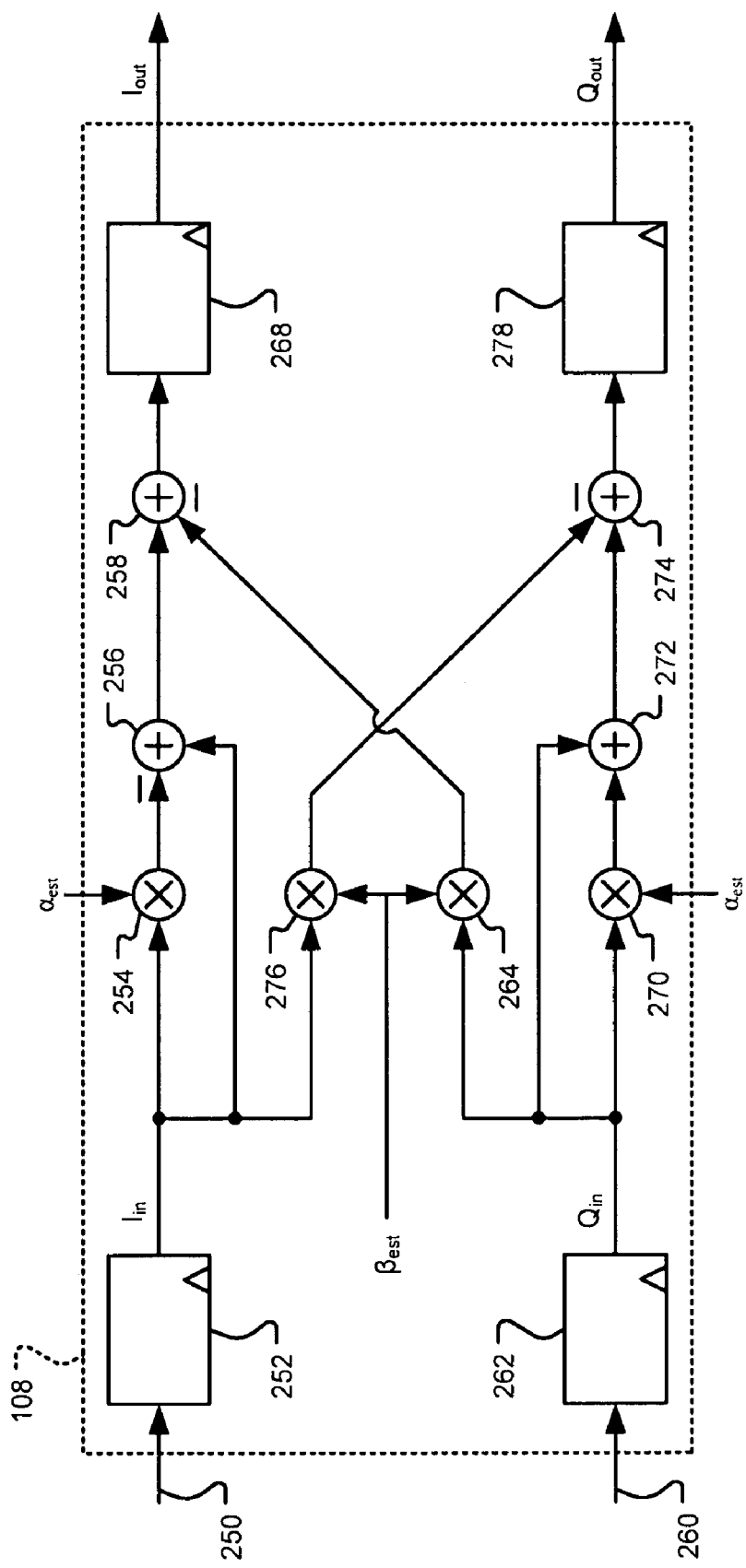
FIG. 5 is a system diagram of prior art I/Q precompensation module that can be used with the transceiver of FIG. 3.

Referring now to FIG. 5, a functional block diagram is shown of an I/Q mismatch precompensation module 108. It should be appreciated that other implementations may also be used. A first input 250 receives the ideal I signal. A buffer 252 buffers the ideal I signal and communicates it to an input of a multiplication module (global) 254. Multiplication module 254 also receives $\alpha_{est}$ 105-1. An output of multiplication module 254 communicates with an inverting input of a summation module 256. A second input of summation module 256 receives the ideal I signal from the output of buffer 252. An output of summation module 256 communicates with an input of a summation module 258. A second input 260 receives the ideal Q signal. A buffer 262 buffers the ideal Q signal and communicates it to an input of a multiplication module 264. A second input of multiplication module 264 receives $\beta_{est}$ 105-2. An output of multiplication module 264 communicates with an inverting input of summation module 258. An output of summation module 258 communicates instantaneous values of the compensated I signal to a buffer 268. An output of buffer 268 generates the compensated I signal.

An input of multiplication module 270 receives the ideal Q signal from the output of buffer 262. A second input of multiplication module 270 receives $\alpha_{est}$ 105-1. An output of multiplication module 270 communicates with an input of a summation module 272. A second input of summation module 272 receives the ideal Q signal from the output of buffer 262. An output of summation module 272 communicates with an input of a summation module 274. A multiplication module 276 receives the ideal I signal from the output of buffer 252 and receives $\beta_{est}$ 105-2. An output of multiplication module 276 communicates with an inverting input of summation module 274. An output of summation module 274 communicates instantaneous values of the compensated Q signal to an input of a buffer 278. An output of buffer 278 generates the compensated Q signal.

Figure 6:
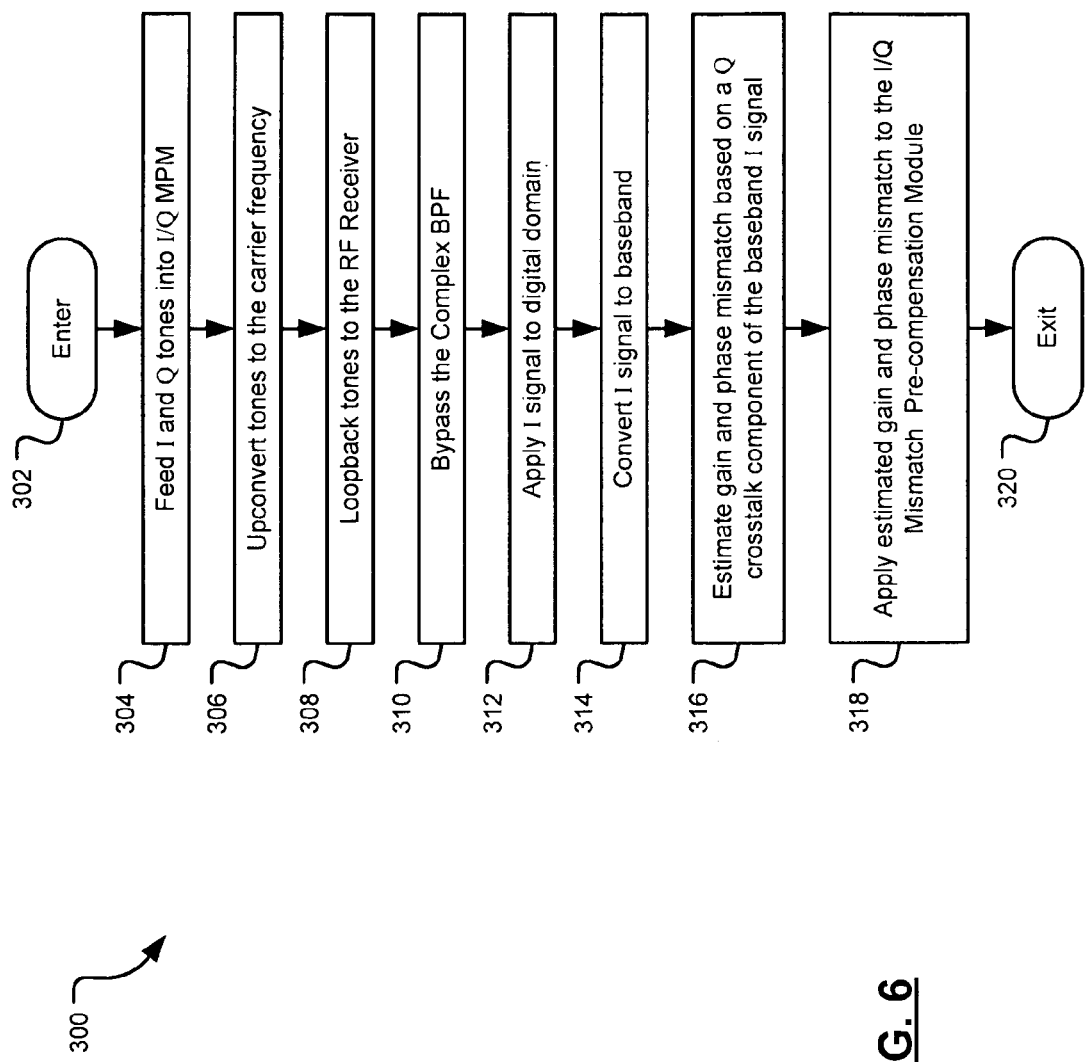
FIG. 6 is a flow chart of a calibration method for the transceiver of FIG. 3.

Referring now to FIG. 6 a method of calibrating the transmitter section 102 of transceiver 100 is shown. The method can be implemented as combinatorial logic and executed when transceiver 100 is turned on. Control enters through a start block 302 and proceeds to block 304. In block 304 control enables reference signal generator 103 to communicate the ideal I and Q signals to the respective inputs of I/Q mismatch precompensation module 108. Control then proceeds to block 306 and upconverts the compensated I and Q signals to the carrier frequency via analog mixers 116. Control then proceeds to block 308 and closes loopback switch 120 to route the RF carrier signal to the input of analog receiver 122. Control then proceeds to block 310 and opens switches 126 and closes switch 127 to bypass the reproduced I component around complex BPF 128. Control then proceeds to block 312 and converts the reproduced I signal to the digital domain via ADC 132. Control then proceeds to block 314 and converts the reproduced I component to the baseband frequency via first digital mixer 136-1. In block 314 control also generates the crosstalk component of the reproduced I component via second digital mixer 136-2. Control then proceeds to block 316 and estimates the amplitude mismatch $\alpha$ and phase mismatch $\beta$ based on Eqs. 10 and 11 respectively. Control then proceeds to block 318 and generates correction signals 105 based on the estimated amplitude mismatch $\alpha$ and the phase mismatch $\beta$. Control then pre-compensates the I and/or Q signals in transmitter section 102. Control then proceeds to other processes via exit block 320.

Figure 7B:
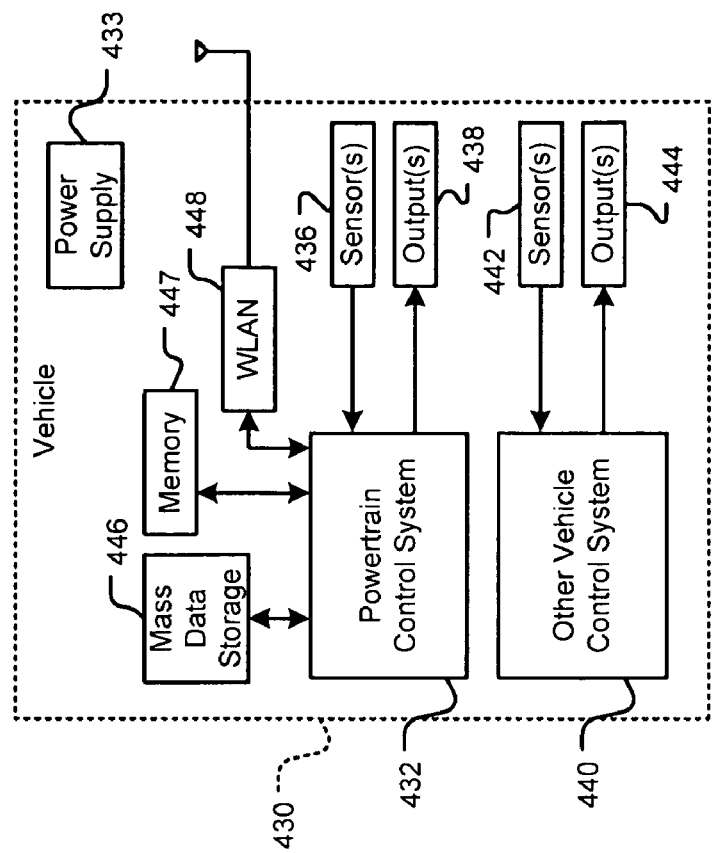
FIG. 7B is a functional block diagram of a vehicle control system.
Figure 7A:
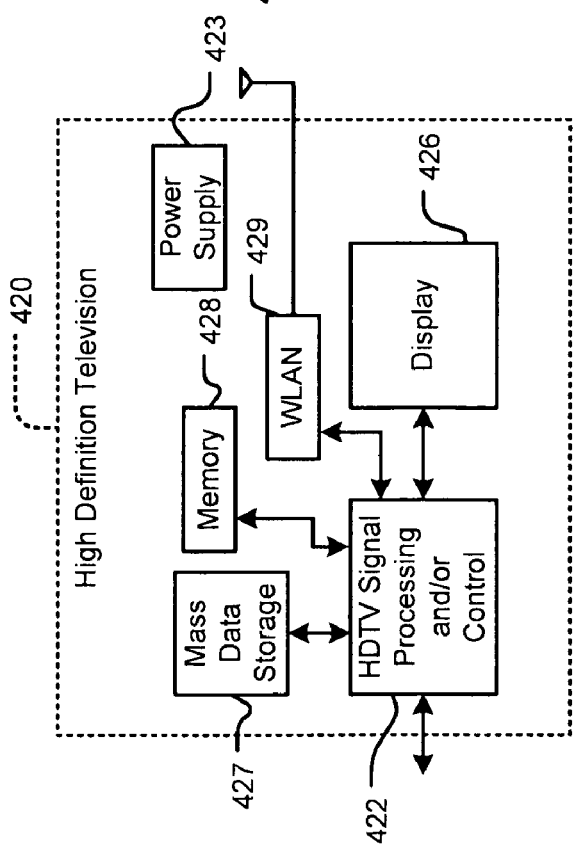
FIG. 7A is a functional block diagram of a high definition television.

Referring now to FIGS. 7A-7G, various exemplary implementations of the I/Q-mismatch compensated transceiver are shown. Referring now to FIG. 7A, the I/Q-mismatch compensated transceiver can be implemented in a high definition television (HDTV) 420. The I/Q-mismatch compensated transceiver may implement and/or be implemented in a wireless local area network (WLAN) and/or wireless personal area network (WPAN) interface 429. An example of a WPAN includes a Bluetooth network. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. Mass data storage 427 may include a digital versatile disc (DVD) drive and/or a mini hard disc drive (HDD). The HDD can include one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN and/or WPAN via the interface 429. HDTV 420 may include a power supply 423.

Referring now to FIG. 7B, the I/Q-mismatch compensated transceiver may implement and/or be implemented in a WLAN and/or WPAN interface 448 of a vehicle 430. Vehicle 430 includes a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

A control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices, such as, HDDs and/or DVDs. One or more of the HDDs may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN and/or WPAN via the interface 448. The control system 440 may also include mass data storage, memory and/or a WLAN and/or WPAN interface (all not shown). Vehicle 430 may also include a power supply 433.

Figure 7C:
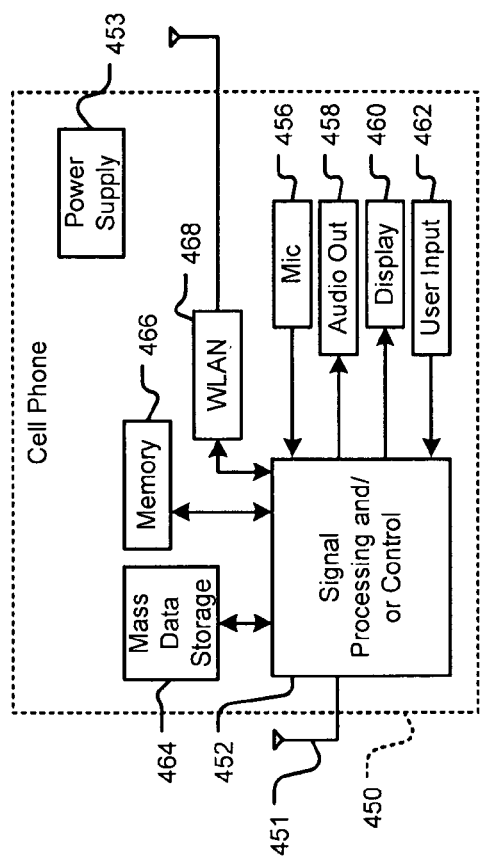
FIG. 7C is a functional block diagram of a cellular phone.

Referring now to FIG. 7C, the I/Q-mismatch compensated transceiver can be implemented in a cellular phone 450 that may include a cellular antenna 451. The I/Q-mismatch compensated transceiver may implement and/or be implemented in a WLAN and/or WPAN interface 468. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example HDDs and/or DVDs. One of more of the HDDs may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN and/or WPAN via the interface 468. Cellular phone 450 may also include a power supply 453.

Figure 7D:
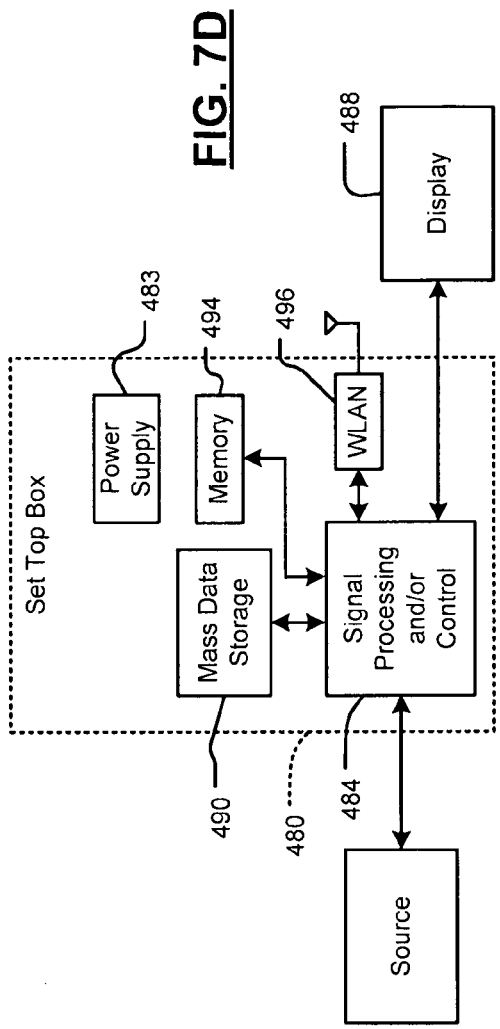
FIG. 7D is a functional block diagram of a set top box.

Referring now to FIG. 7D, the I/Q-mismatch compensated transceiver can be implemented in a set top box 480. The I/Q-mismatch compensated transceiver may implement and/or or be implemented in a WLAN and/or WPAN interface 496. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box functions.

The set top box 480 may communicate with mass data storage 490 that stores data in a nonvolatile manner. The mass data storage 490 may include optical and/or magnetic storage devices, such as, HDDs and/or DVDs. One or more of the HDDs may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN and/or WPAN via the interface 496. The set top box 480 may also include a power supply 483.

Figure 7E:
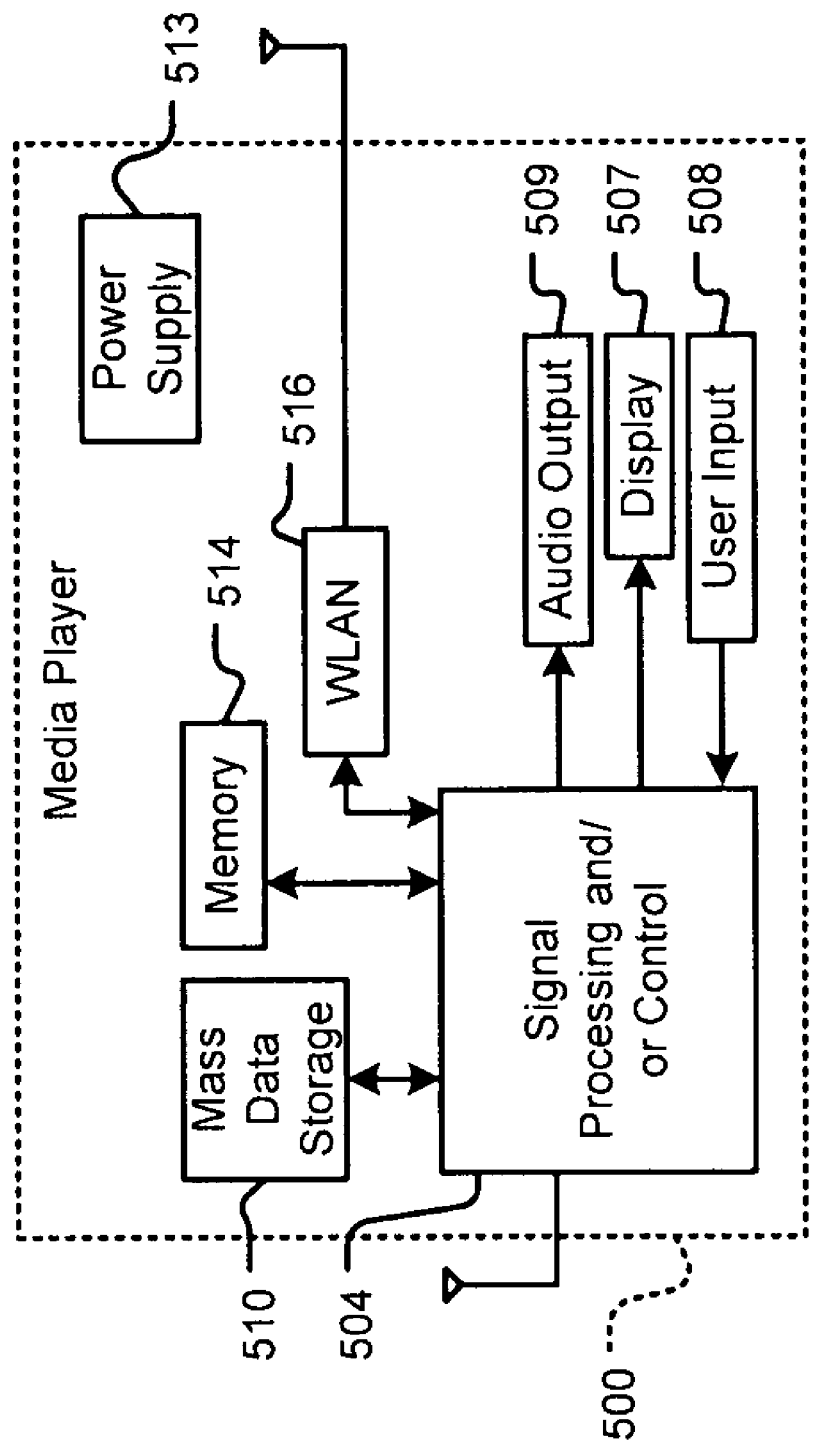
FIG. 7E is a functional block diagram of a media player.

Referring now to FIG. 7E, the I/Q-mismatch compensated transceiver can be implemented in a media player 500. The I/Q-mismatch compensated transceiver may implement and/or be implemented in a WLAN and/or WPAN interface 516. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player functions.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include optical and/or magnetic storage devices, such as, HDDs and/or DVDs. One or more of the HDDs may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN and/or WPAN via the interface 516. The media player 500 may also include a power supply 513. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A method for compensating a transmit signal comprising at least two modulated carriers, the method comprising:
   mixing a first modulated carrier of the at least two modulated carriers with a first predetermined signal to reproduce a first component of the transmit signal at an intermediate frequency;
   converting the first component of the transmit signal to a corresponding digital signal;
   mixing the digital signal with a second predetermined signal to reproduce the first component of the transmit signal at a baseband frequency;
   mixing the digital signal with a third predetermined signal to reproduce a portion of a second component of the transmit signal at the baseband frequency; and
   estimating an amplitude mismatch and a phase mismatch between the at least two modulated carriers of the transmit signal based on (i) the first component of the transmit signal at the baseband frequency and (ii) the portion of the second component of the transmit signal at the baseband frequency.

2. The method of claim 1, wherein the mixing of the first modulated carrier of the at least two modulated carriers with the first predetermined signal comprises mixing the first modulated carrier with a signal based on $\cos((\omega_c - \omega_{if})t)$, where $\omega_c$ represents a period of the first modulated carrier, $\omega_{if}$ represent a period of the intermediate frequency, and t represents time.

3. The method of claim 2, wherein:
   the mixing of the digital signal with the second predetermined signal comprises mixing the digital signal with a signal based on $\cos(\omega_{if} t)$; and
   the mixing of the digital signal with the third predetermined signal comprises mixing the digital signal with a signal based on $\sin(\omega_{if} t)$.

4. The method of claim 1, wherein the estimating of the amplitude mismatch and the phase mismatch between the at least two modulated carriers of the transmit signal comprises employing one or more of (i) a difference function or (ii) a multiplication function.

5. The method of claim 1, wherein the transmit signal comprises a quadrature-amplitude modulated (QAM) signal.

6. The method of claim 1, wherein the estimating of the amplitude mismatch and the phase mismatch between the at least two modulated carriers of the transmit signal comprises scaling one or more of (i) a magnitude of the amplitude mismatch or (ii) a magnitude of the phase mismatch.

7. The method of claim 1, further comprising generating a compensated transmit signal based on (i) the estimated amplitude mismatch and (ii) the estimated phase mismatch between the at least two modulated carriers.

8. A transceiver comprising:
   an analog mixer configured to mix a first modulated carrier of at least two modulated carriers with a first predetermined signal to reproduce a first component of a transmit signal at an intermediate frequency;
   an analog-to-digital converter configured to convert the first component of the transmit signal to a corresponding digital signal;
   a first digital mixer configured to mix the digital signal with a second predetermined signal to reproduce the first component of the transmit signal at a baseband frequency;
   a second digital mixer configured to mix the digital signal with a third predetermined signal to reproduce a portion of a second component of the transmit signal at the baseband frequency; and
   a calibration module configured to estimate an amplitude mismatch and a phase mismatch between the at least two modulated carriers of the transmit signal based on (i) the first component of the transmit signal at the baseband frequency and (ii) the portion of the second component of the transmit signal at the baseband frequency.

9. The transceiver of claim 8, wherein the first predetermined signal is based on $\cos((\omega_c - \omega_{if})t)$, where $\omega_c$ represents a period of the first modulated carrier, $\omega_{if}$ represent a period of the intermediate frequency, and t represents time.

10. The transceiver of claim 9, wherein:
    the second predetermined signal is based on $\cos(\omega_{if} t)$; and
    the third predetermined signal is based on $\sin(\omega_{if} t)$.

11. The transceiver of claim 8, wherein the transmit signal comprises a quadrature-amplitude modulated (QAM) signal.

12. The transceiver of claim 8, further comprising a pre-compensation module configured to generate a compensated transmit signal based on (i) the estimated amplitude mismatch and (ii) the estimated phase mismatch between the at least two modulated carriers.

13. A system comprising the transceiver of claim 8.

14. The system of claim 13, wherein the system comprises one of a high definition television, a vehicle, a cellular phone, a set top box, or a media player.

15. A calibration module, comprising:
an absolute value module configured to generate (i) a first magnitude signal based on a first component signal and (ii) a second magnitude signal, based on a second component signal;
a first module configured to generate an amplitude correction signal for a quadrature-amplitude modulated (QAM) signal based on (i) the first magnitude signal and (ii) the second magnitude signal; and
a second module configured to generate a phase correction signal for the QAM signal based on (i) the first component signal and (ii) the second component signal.

16. The calibration module of claim 15, wherein the first module employs a difference function.

17. The calibration module of claim 16, wherein the second module employs a multiplication function.

18. The calibration module of claim 15, wherein the first signal includes a first phase angle, wherein the second signal is out-of-phase with the first phase angle.

19. The calibration module of claim 18, wherein the second signal is approximately ninety degrees out-of-phase with the first phase angle.

20. The calibration module of claim 15, further comprising a multiplication module configured to multiply magnitudes of respective ones of the amplitude correction signal and the phase correction signal.

21. The calibration module of claim 15, further comprising a buffer configured to store the amplitude correction signal and the phase correction signal.

22. The calibration module of claim 21, wherein the buffer includes inputs and outputs, and further comprising feedback paths between the inputs and the outputs.

23. The calibration module of claim 22 wherein at least one of the feedback paths includes a saturation module configured to limit magnitude of a feedback signal.

24. A QAM mode transmitter comprising the calibration module of claim 15.

25. The QAM mode transmitter of claim 24, further comprising:
a compensation module configured to generate a compensated in-phase (I) signal and a compensated quadrature (Q) signal based on the amplitude correction signal and the phase correction signal;
a first analog mixer; and
a second analog mixer,
wherein the first analog mixer is configured to convert the compensated I signal to a carrier frequency, and
wherein the second analog mixer is configured to convert the compensated Q signal to the carrier frequency.

26. A method of calibrating a quadrature-amplitude modulated (QAM) signal, comprising:
generating a first magnitude signal based on a first component signal;
generating a second magnitude signal based on a second component signal;
generating an amplitude correction signal for the QAM signal based on the first magnitude signal and the second magnitude signal; and
generating a phase correction signal for the QAM signal based on the first component signal and the second component signal.

27. The method of claim 26, wherein the generating of the amplitude correction signal employs a difference function.

28. The method of claim 26, wherein the generating of the phase correction signal employs a multiplication function.

29. The method of claim 26, wherein the first component signal includes a first phase angle and the second component signal is out-of-phase with the first phase angle.

30. The method of claim 29, wherein the second component signal is approximately ninety degrees out-of-phase with the first phase angle.

31. The method of claim 26, further comprising scaling magnitudes of the amplitude correction signal and the phase correction signal.

32. The method of claim 26, further comprising buffering the amplitude correction signal and the phase correction signal.

33. The method of claim 32, wherein:
the amplitude correction signal is buffered via a first buffer to generate a first feedback signal; and
the phase correction signal is buffered via a second buffer to generate a second feedback signal.

34. The method of claim 33, further comprising limiting magnitudes of the first feedback signal and the second feedback signal.

35. The method of claim 1, further comprising receiving the at least two modulated carriers via a receiver, wherein:
the mixing of the first modulated carrier of the at least two modulated carriers with the first predetermined signal is performed subsequent to the receiving of the at least two modulated carriers; and
the mixing of the digital signal with the second predetermined signal is performed by the receiver and subsequent to the mixing of the first modulated carrier of the at least two modulated carriers with the first predetermined signal.

36. The method of claim 1, wherein the mixing of the digital signal with the second predetermined signal and the mixing of the digital signal with the third predetermined signal include downconverting frequency of the digital signal to the baseband frequency.

37. The method of claim 1, wherein the portion of the second component is a crosstalk portion of the first component corresponding to component mismatch in the transmit signal.

* * * * *